US006765228B2

(12) United States Patent
Lin et al.

(10) Patent No.: US 6,765,228 B2
(45) Date of Patent: Jul. 20, 2004

(54) BONDING PAD WITH SEPARATE BONDING AND PROBING AREAS

(75) Inventors: Kuan-Min Lin, Taipei (TW); Jin-Ji Shen, Hsinchu (TW)

(73) Assignee: Taiwan Semiconductor Maunfacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/269,468

(22) Filed: Oct. 11, 2002

(65) Prior Publication Data

US 2004/0069988 A1 Apr. 15, 2004

(51) Int. Cl.[7] ............................................. H01L 23/58
(52) U.S. Cl. .................... 257/48; 257/781; 257/782; 257/783; 257/784
(58) Field of Search ................ 257/48, 781–784, 257/747, 748

(56) References Cited

U.S. PATENT DOCUMENTS

2002/0175411 A1 * 11/2002 Harun et al. ................. 257/747
2003/0173667 A1 * 9/2003 Yong et al. .................. 257/748

* cited by examiner

*Primary Examiner*—Wael Fahmy
*Assistant Examiner*—Nathan W. Ha
(74) *Attorney, Agent, or Firm*—Tung & Associates

(57) ABSTRACT

A new and improved bonding pad having separate areas for probe needle contact and wire bonding in semiconductor packaging technology. The bonding pad typically has a generally elongated, rectangular configuration with a wire bonding area at one end and a probe needle contact area at the other end of the pad. At least one notch mark may be provided on or adjacent to the bonding pad between the wire bonding area and the probe needle contact area for demarcating these areas during chip production.

17 Claims, 2 Drawing Sheets

BONDING PAD WITH SEPARATE BONDING AND PROBING AREAS

FIELD OF THE INVENTION

The present invention relates to packaging of semiconductor integrated circuits. More particularly, the present invention relates to a new and improved bonding pad having separate areas for probe needle contact and wire bonding in semiconductor packaging technology.

BACKGROUND OF THE INVENTION

One of the last processes in the production of semiconductor integrated circuits (IC) is multi-leveled packaging, which includes expanding the electrode pitch of the IC chips containing the circuits for subsequent levels of packaging; protecting the chip from mechanical and environmental stress; providing proper thermal paths for channeling heat dissipated by the chip; and forming electronic interconnections. The manner in which the IC chips are packaged dictates the overall cost, performance, and reliability of the packaged chips, as well as of the system in which the package is applied.

Package types for IC chips can be broadly classified into two groups: hermetic-ceramic packages and plastic packages. A chip packaged in a hermetic package is isolated from the ambient environment by a vacuum-tight enclosure. The package is typically ceramic and is utilized in high-performance applications. A chip packaged in a plastic package, on the other hand, is not completely isolated from the ambient environment because the package is composed of an epoxy-based resin. Consequently, ambient air is able to penetrate the package and adversely affect the chip over time. Recent advances in plastic packaging, however, has expanded their application and performance capability. Plastic packages are cost-effective due to the fact that the production process is typically facilitated by automated batch-handling.

A recent development in the packaging of IC chips is the ball grid array (BGA) package, which may be utilized with either ceramic packages or plastic packages and involves different types of internal package structures. The BGA package uses multiple solder balls or bumps for electrical and mechanical interconnection of IC chips to other microelectronic devices. The solder bumps serve to both secure the IC chip to a circuit board and electrically interconnect the chip circuitry to a conductor pattern formed on the circuit board. The BGA technique is included under a broader connection technology known as "Controlled Collapse Chip Connection-C4" or "flip-chip" technology.

Flip chip technology can be used in conjunction with a variety of circuit board types, including ceramic substrates, printed wiring boards, flexible circuits, and silicon substrates. The solder bumps are typically located at the perimeter of the flip chip on electrically conductive bond pads that are electrically interconnected with the circuitry on the flip chip. Because of the numerous functions typically performed by the microcircuitry of a flip chip, a relatively large number of solder bumps are often required. The size of a flip chip is typically on the order of about thirteen millimeters per side, resulting in crowding of the solder bumps along the perimeter of the flip chip. Consequently, flip chip conductor patterns are typically composed of numerous individual conductors that are often spaced apart about 0.1 millimeter or less.

Wirebonding is the most common technique for establishing electrical connection between the bonding pads on the surface of a chip or die and the inner lead terminals, or posts, on the leadframe or substrate. A section of a typical conventional wirebonded chip 26 is shown schematically in FIG. 1 and may include multiple wire bonding balls 10, each of which is directly bonded to the continuous upper surface of a bonding pad 14, typically rectangular in configuration, as shown in FIG. 1A, and partially covered by a passivation layer 12. A pad opening 13 in the passivation layer 12 exposes the bonding pad 14, through which pad opening 13 the bonding ball 10 extends. The bonding pad 14 is surrounded by a dielectric layer 15 such as an oxide in the chip 26. As further shown in FIG. 1, the bonding pad 14 is provided in electrical contact with an upper conductive layer 16, which is separated from an underlying conductive layer 22 by an insulative layer 18. The conductive layers 16, 22 are disposed in electrical contact with each other through conductive vias 20 that extend through the insulative layers 18. The various insulative layers 18 and conductive layers 22 are sequentially deposited on a silicon substrate 24 throughout semiconductor fabrication, in conventional fashion. Each bonding ball 10 connects a bonding wire 28, through a lead 30, to the terminals (not shown) on the leadframe or substrate (not shown), as shown in FIG. 2.

As further shown in FIG. 2, the bonding pads 14 are typically arranged in rows which extend adjacent to respective edges of the chip 26. Prior to packaging and formation of the bonding balls 10 on the respective bonding pads 14, the chip 26 is subjected to parametric testing which utilizes test structures to assess the electrical characteristics and reliability of the devices on the wafer. Probe cards are typically used as an interface between the devices on the chip and automated test equipment. The probe card typically includes a printed circuit board from which extends multiple probe needles 34, each of which is disposed in electrical contact with the device through the respective bonding pads 14, as shown in FIG. 3. Each probe needle 34 typically contacts the approximate center of the bonding pad 14 at a pressure of typically about 2–3 grams. Consequently, the probe needle 34 typically forms a scrub mark 32 and a hump 33 of pad material in the center of the bonding pad 14, as shown in FIG. 4.

As further shown in FIGS. 3 and 4, the probe needle contact area 8, which was contacted by the probe needle 34 in the testing step, substantially overlaps and typically circumscribes the wire bonding area 6 on the bonding pad 14 to which the bonding ball 10 is subsequently bonded in the packaging step. Due to the presence of the probe needle scrub mark 32 and the hump 33 in the surface of the bonding pad 14, such an overlap area between the wire bonding area 6 and the probe needle contact area 8 on the bonding pad 14 reduces the effective bonding area for the bonding ball 10 on the bump pad 14. This decreased bonding area for the bonding ball 10 tends to reduce effective bonding of the bonding ball 10 to the bonding pad 14. Accordingly, there is an established need for a new layout for a bonding pad which provides separate test probing and ball or wire bonding areas on the bonding pad.

An object of the present invention is to provide a new and improved layout for a bonding pad for IC (integrated circuit) chips.

Another object of the present invention is to provide a method which enhances wafer sort yield and productivity by relaxing probe mark specifications in the testing of chips.

Still another object of the present invention is to provide a method for providing separate areas for test probing and bonding on a bonding pad and demarcating the areas during chip production.

Another embodiment of the present invention is to provide a new and improved bonding pad which enhances bonding of a solder bump or bond wire to the bump pad.

Still another embodiment of the present invention is to provide a new and improved bonding pad which provides a bonding area which is sufficiently large for effective bonding of a solder bump or bond wire to the bump pad.

Yet another object of the present invention is to provide a new and improved bonding pad which provides an intact bonding area for the bonding of a solder bump or a bond wire to the bonding pad.

Still another object of the present invention is to provide a new and improved bonding pad which is particularly advantageous for fine pitch pad design applications.

A still further object of the present invention is to provide a new and improved bonding pad which provides separate areas for probe needle contact and solder bump or wire bonding on the pad.

Another object of the present invention is to provide a new and improved bonding pad in which probe needle contact and solder bump or wire bonding areas on the pad are indicated by a visual mark.

Yet another object of the present invention is to provide a new and improved bonding pad provided with one or multiple notch marks for separating an area for probe needle contact from an area for solder bump or wire bonding in the pad.

Another object of the present invention is to provide a method which is suitable for both flip chip bumping and wire bonding technologies.

SUMMARY OF THE INVENTION

In accordance with these and other objects and advantages, the present invention is generally directed to a new and improved bonding pad having separate areas for probe needle contact and wire bonding in semiconductor packaging technology. The bonding pad typically has a generally elongated, rectangular configuration with a wire bonding area at one end and a probe needle contact area at the other end of the pad. At least one notch mark may be provided on or adjacent to the bonding pad between the wire bonding area and the probe needle contact area for demarcating these areas during chip production.

BRIEF DESCRIPTION OF THE DRAWINGS

The invention will now be described, by way of example, with reference to the accompanying drawings, in which.

DESCRIPTION OF THE PREFERRED EMBODIMENTS

The present invention includes a new and improved bonding pad and a method of forming a bonding pad having separate areas on the surface thereof for contact of a probe needle during chip testing and bonding of bond wires to the chip in semiconductor packaging technology. The bonding pad may have a generally elongated, rectangular configuration with the wire bonding area at one end and a probe needle contact area at the other end of the pad. At least one, and preferably, two notch marks may be provided on or adjacent to the bonding pad between the wire bonding area and the probe needle contact area for demarcating these areas during chip production. The bonding pad of the present invention is suitable for wire bonding techniques, as well as ball grid array (BGA) and flip-chip packaging techniques.

Figure 1:
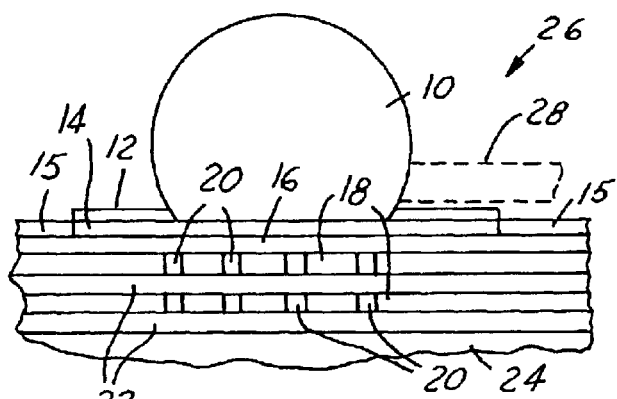
FIG. 1 is a schematic view illustrating a wire bonding ball bonded to a bonding pad in conventional fashion.
Figure 1A:
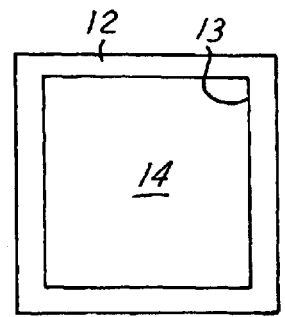
FIG. 1A is a top view of a conventional bonding pad embedded in a chip surface prior to bonding of a wire or solder bump to the bonding pad.
Figure 2:
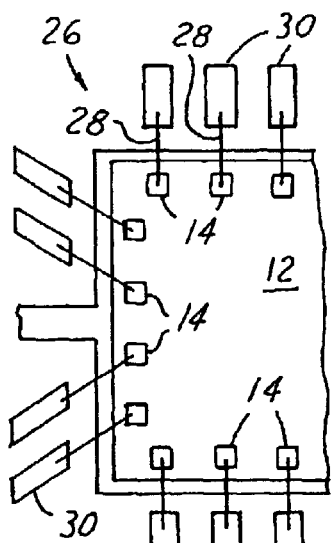
FIG. 2 is a top view, partially in section, of a conventional wirebonded chip or die.
Figure 3:
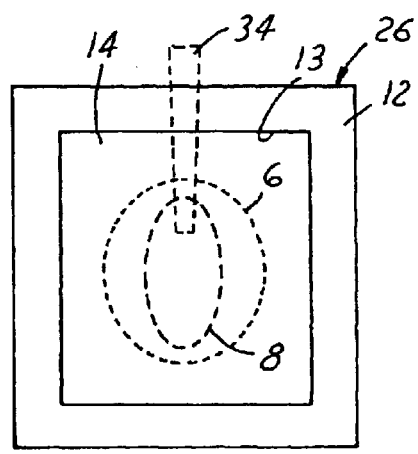
FIG. 3 is a top view of a bonding pad of a conventional wirebonded chip, illustrating conventional overlapping wire bonding and probe needle contact areas on the chip.
Figure 4:
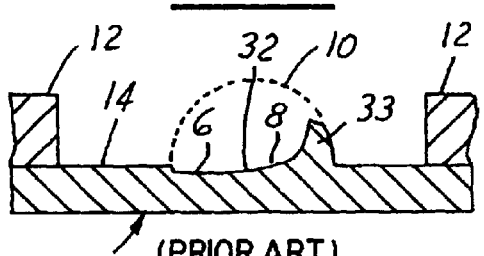
FIG. 4 is a cross-sectional view of a bonding pad of a conventional wirebonded chip, illustrating formation of a probe needle scrub mark in the wire bonding area of the bonding pad prior to bonding of a wire to the bonding pad, in conventional fashion.
Figure 5:
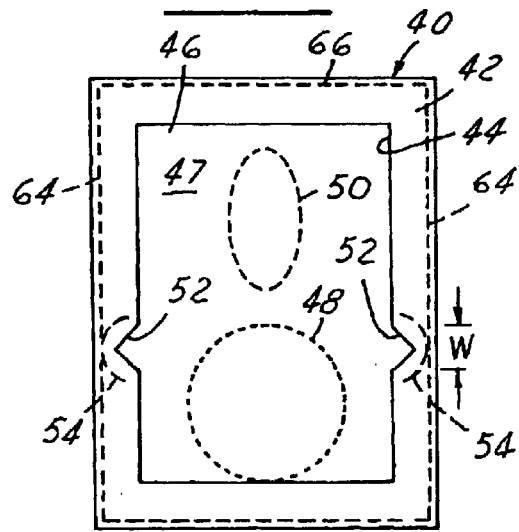
FIG. 5 is a top view of a bonding pad of the present invention, illustrating separate wire bonding and probe needle contact areas on the chip.
Figure 6:
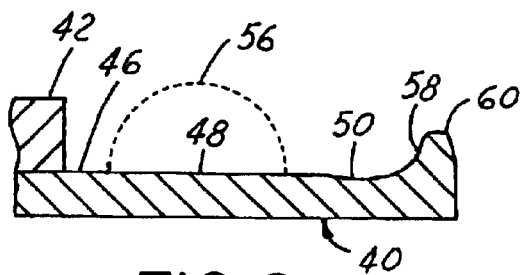
FIG. 6 is a cross-sectional view of a bonding pad of the present invention.
Figure 7:
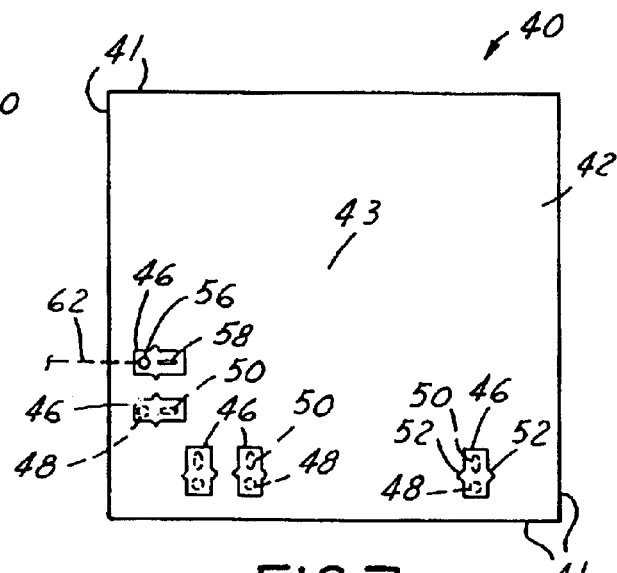
FIG. 7 is a top view of a chip or die in implementation of the present invention.

An illustrative embodiment of a chip or die in implementation of the present invention is generally indicated by reference numeral 40 in FIG. 7. The chip 40 is typically one of multiple chips having had integrated circuits (not shown) previously fabricated thereon on a semiconductor wafer substrate (not shown). The surface of the chip 40 is typically defined by a dielectric passivation layer 42, in conventional fashion, and multiple bonding pads 46 of the present invention are typically embedded in the passivation layer 42, in electrical contact with integrated circuits (not shown) formed in the chip 40, typically in conventional fashion. The bonding pads 46 of the present invention are typically arranged in rows that extend adjacent to the respective edges 41 of the chip 40. However, the bonding pads 46 may be arranged in any desired alternative configuration on the chip 40 consistent with the particular use requirements of the chip 40. As shown in FIG. 5, each bonding pad 46 typically has a generally elongated, rectangular shape, having longitudinal edges 64 and transverse edges 66 that may be overlapped by the passivation layer 42. However, the bonding pad 46 may alternatively have a square-shaped configuration wherein the longitudinal edges 64 and the transverse edges 66 are the same length. In that case, each longitudinal edge 64 and each transverse edge 66 may be typically from about 60 μm to about 90 μm in length. Each bonding pad 46 may be constructed of aluminum or other suitable electrically-conductive material. A rectangular pad opening 44 extends through the passivation layer 42 to expose the upper surface of the bonding pad 46.

As further shown in FIG. 5, a wire bonding area 48 is located on the surface 47 of each bonding pad 46, adjacent to one of the transverse edges 66 thereof, and a probe needle contact area 50 is also located on the surface 47 of the bonding pad 46, adjacent to the opposite transverse edge 66 thereof. Accordingly, the wire bonding area 48 and the probe needle contact area 50 are located in separate, non-overlapping areas on the surface 47 of the bonding pad 46. At least one, and preferably, a pair of notch marks 52, which may be V-shaped, as shown by the solid lines, or arcuate, as shown by the broken lines 54, is typically cut in the passivation layer 42 at the edge of the pad opening 44, between the wire bonding area 48 and the probe needle contact area 50. The notch mark or marks 52 serve to clearly indicate the locations of the wire bonding area 48 and the probe needle contact area 50 on the bonding pad 46. Each of the notch marks 52 has a width "W" of typically about 2 $\mu$m. As shown in FIG. 7, each of the bonding pads 46 is oriented on the chip 40 typically with the wire bonding area 48 located on the region of the bonding pad 46 that is disposed adjacent to a corresponding edge of the chip 40 and the probe needle contact area 50 located on the region of the bonding pad 46 that is disposed toward the center 43 of the chip 40. Accordingly, the probe needle contact area 50 on each bonding pad 46 is typically disposed between the center 43 of the chip 40 and the bonding area 48 on the same bonding pad 46. However, it is understood that other orientations of the bonding pads 46 on the chip 40 are possible without departing from the spirit and scope of the invention.

Figure 8:
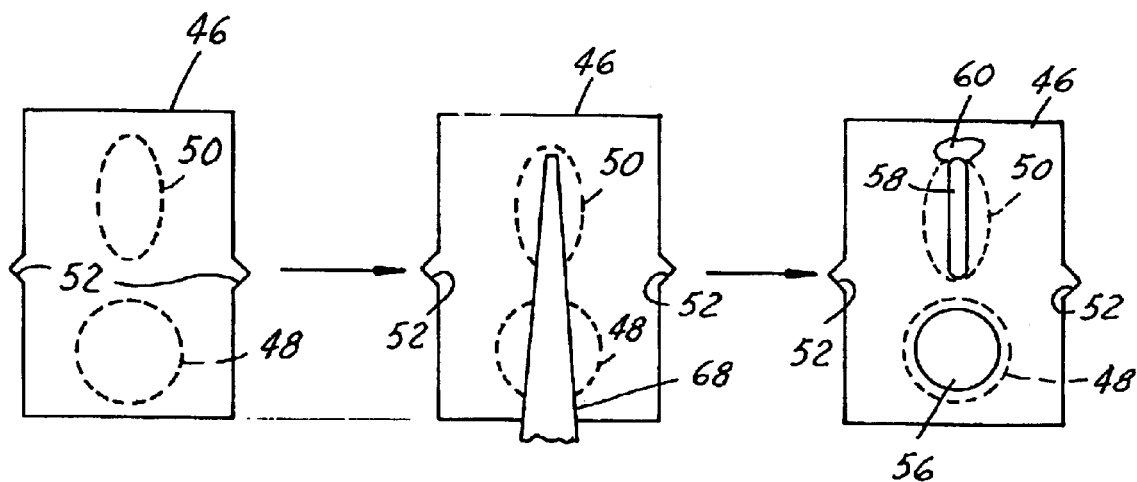
FIG. 8 is a flow diagram illustrating initial contact of a probe needle with the probe needle contact area on a bonding pad of the present invention, followed by bonding of a bond wire to the wire bonding area of the bonding pad.

Referring next to FIGS. 5–8, in typical application of the present invention, the chip 40, with the bonding pads 46 of the present invention fabricated thereon, as shown in FIG. 7, is initially subjected to conventional parametric testing by which the electrical characteristics and reliability of the devices or circuits on the chip 40 are tested. Probe cards (not shown), which may be conventional, are typically used as an interface between the devices on the chip 40 and conventional automated test equipment (not shown). The probe card typically includes a printed circuit board from which extends multiple probe needles 68 (one of which is shown in FIG. 8), which probe needles 68 are disposed in electrical contact with the chip 40 through the respective bonding pads 46. As shown in FIG. 8, during the parametric testing procedure, the tip of each probe needle 68 contacts the probe needle contact area 50 of the corresponding bonding pad 44 and forms a scrub mark 58 and a hump 60 of pad material in the bonding pad 46, as further shown in FIGS. 6 and 8. Accordingly, the wire bonding area 48 on the surface of the bonding pad 46 remains intact and undisturbed since the probe needle scrub mark 58 is localized to the probe needle contact area 50 and does not extend to the adjacent wire bonding area 48. Finally, the bonding ball 56 or other electrical contact is formed on the wire bonding area 48 of the bonding pad 46 for electrical contact with a bonding wire 62 that connects the chip 40 to terminals (not shown) on a leadframe or substrate (not shown), in conventional fashion during packaging of the chip 40. Because the bonding area 48 on the bonding pad 46 remains intact and undisturbed by the needle scrub mark 58 and the hump 60 of pad material, there remains a larger bonding area for the bonding ball 56 or other electrical contact with the bonding pad surface 47, resulting in a strong and reliable mechanical bond for electrical conduction between the bonding ball 56 and the bonding pad surface 47, which is particularly important in fine pitch design applications.

While the preferred embodiments of the invention have been described above, it will be recognized and understood that various modifications may be made in the invention and the appended claims are intended to cover all such modifications which may fall within the spirit and scope of the invention.

What is claimed is:

1. A bonding pad comprising:
    a bonding pad surface having opposite edges and a probe needle contact area for contact of a probe needle with said bonding pad surface;
    a bonding area provided on said bonding pad surface in non-overlapping relationship to said probe needle contact area for bonding of an electrical contact to said bonding pad surface; and
    a generally concave mark provided at at least one of said opposite edges between said probe needle contact area and said bonding area for demarcating said probe needle contact area from said bonding area.

2. The bonding pad of claim 1 wherein said generally concave mark has a generally V-shaped configuration.

3. The bonding pad of claim 1 wherein said bonding pad surface comprises aluminum.

4. The bonding pad of claim 3 wherein said generally concave mark has a generally V-shaped configuration.

5. The bonding pad of claim 1 wherein said bonding pad surface has a substantially elongated, rectangular configuration.

6. The bonding pad of claim 5 wherein said generally concave mark has a generally V-shaped configuration.

7. The bonding pad of claim 5 wherein said bonding pad surface comprises aluminum.

8. The bonding pad of claim 7 wherein said generally concave mark has a generally V-shaped configuration.

9. A chip comprising:
    a chip surface;
    a passivation layer provided on said chip surface;
    at least one bonding pad embedded in said passivation layer, said at least one bonding pad comprising opposite edges and a bonding pad surface having a probe needle contact area for contact of a probe needle with said bonding pad surface and a bonding area provided on said bonding pad surface in non-overlapping relationship to said probe needle contact area for bonding of an electrical contact to said bonding pad surface; and
    at least one generally concave notch mark provided in said passivation layer adjacent to at least one of said opposite edges and between said probe needle contact area and said bonding area.

10. The chip of claim 9 wherein said at least one generally concave notch mark comprises a pair of generally arcuate notch marks provided in said passivation layer adjacent to said opposite edges, respectively.

11. The chip of claim 9 wherein said bonding pad surface has a substantially elongated, rectangular configuration.

12. The chip of claim 11 wherein said at least one generally concave notch mark comprises a pair of generally arcuate notch marks provided in said passivation layer adjacent to said opposite edges, respectively.

13. The chip of claim 9 wherein said at least one generally concave notch mark comprises a pair of V-shaped notch marks provided in said passivation layer adjacent to said opposite edges, respectively.

14. The chip of claim 13 wherein said bonding pad surface has a substantially elongated, rectangular configuration.

15. The chip of claim 9 wherein said chip surface comprises a center and a plurality of edges spaced from said center and wherein said probe needle contact area is located between said center of said chip surface and said bonding area.

16. The chip of claim 15 wherein said bonding pad surface has a substantially elongated, rectangular configuration.

17. The chip of claim 16 wherein said at least one generally concave notch mark comprises a pair of V-shaped notch marks provided in said passivation layer adjacent to said opposite edges, respectively.

* * * * *